United States Patent
Lessing

Patent Number: 5,464,583
Date of Patent: Nov. 7, 1995

[54] METHOD FOR MANUFACTURING WHISKER PREFORMS AND COMPOSITES

[75] Inventor: Paul A. Lessing, Idaho Falls, Id.

[73] Assignee: Lockheed Idaho Technologies Company, Idaho Falls, Id.

[21] Appl. No.: 100,008

[22] Filed: Jul. 29, 1993

[51] Int. Cl.$^6$ .......................... C04B 35/80; C04B 35/81
[52] U.S. Cl. .................. 264/60; 264/62; 264/63; 264/65; 501/95
[58] Field of Search ................. 264/60, 65, 63, 264/62; 501/95

[56] References Cited

U.S. PATENT DOCUMENTS

| | | | |
|---|---|---|---|
| 4,097,293 | 6/1978 | Komeya | 264/65 |
| 4,717,693 | 1/1988 | Wittmer | 501/95 |
| 4,753,764 | 6/1988 | Kamijo | 264/65 |
| 5,030,600 | 7/1991 | Hida | 501/98 |
| 5,118,645 | 6/1992 | Pyzik | 501/95 |

*Primary Examiner*—James Derrington
*Assistant Examiner*—D. Robinson
*Attorney, Agent, or Firm*—Alan D. Kirsch

[57] ABSTRACT

A process for manufacturing $Si_3N_4$/SiAlON whiskers by mixing silicon carbide powder with aluminum nitride powder, adding impurities such as calcium oxide or potassium chloride to control whisker characteristics, forming the mixture in a boron nitrogen mold of desired shaped and hot isostatically pressing the formed mixture in a nitrogen environment to produce whiskers comprised substantially of SiAlON at the nucleating end of the whisker and $Si_3N_4$ at the other end of the whisker. In one embodiment, reinforced composites are formed by impregnating the $Si_3N_4$/SiAlON whisker preform with a matrix material such as resin binders, liquid metals, intermetallics or ceramic materials.

20 Claims, No Drawings

METHOD FOR MANUFACTURING WHISKER PREFORMS AND COMPOSITES

CONTRACTURAL ORIGIN OF THE INVENTION

The United States Government has rights in this invention pursuant to Contract No. DE-AC07-76ID01570 between the U.S. Department of Energy and EG&G Idaho, Inc.

BACKGROUND OF THE INVENTION

This invention relates to a method for producing whisker preforms and composites and more particularly to a method for producing $Si_3N_4$/SiAlON blend whisker preforms and composites.

The development of fiber reinforced composites has created a demand for reinforcement in the form of elongated, single-crystal fibers known as whiskers. Whiskers have been very popular in recent years as a reinforcement material for metal matrix composites (MMC) and ceramic matrix composites (CMC). The term whisker generally applies to any single-crystal fiber having a thickness less than 0.1 mm and a length to thickness ratio of at least 10:1.

Silicon nitride ($S_3N_4$) is considered a highly desirable reinforcement material because of its high strength, wear-resistance, high decomposition temperature, oxidation resistance, excellent thermal shock properties, low coefficient of friction and resistance to corrosive environments. In addition, a material generally referred to by its acronym SiAlON (a solid solution consisting of silicon, aluminum, oxygen and nitrogen in a range of compositions) is also considered a desirable reinforcement material because of its high mechanical strength at room temperatures and above, high specific strength, hardness and toughness and low coefficient of friction and thermal expansion, and is also chemically inert and creep and oxidation resistance.

Major factors for selecting whiskers for reinforcing MMCs and CMCs are (1) compatibility of the interfacial bonding between matrices and whiskers, (2) geometrical factors of the whiskers such as shape, size and length/diameter (aspect) ratio, and (3) compatibility in physical properties such as thermal expansion coefficient of the matrix and reinforcing materials. By producing whiskers that are comprised of both $Si_3N_4$ and SiAlON, (i.e., $Si_3N_4$ at one end of the whisker and SiAlON at the other end), it is possible to provide a reinforcing material for a MMC or CMC utilizing the unique characteristics of both $Si_3N_4$ and SiAlON whiskers.

It is an object of the present invention to provide a method for manufacturing $Si_3N_4$/SiAlON whisker preforms whereby the physical characteristics of the whisker can be manipulated through the controlled introduction of impurities into the manufacturing process.

It is another object of the present invention to provide a whisker preform having a unique composition of SiAlON at the nucleating end of the whisker and $Si_3N_4$ at the other end of the whisker.

It is still another object of this invention to provide a method for manufacturing $Si_3N_4$/SiAlON whisker preforms and composites from readily available and low cost raw materials such as silicon carbide powder.

Additional objects, advantages and novel features of the invention will become apparent to those skilled in the art upon examination of the following and by practice of the invention.

SUMMARY OF THE INVENTION

To achieve the foregoing and other objects, a method is provided for producing whiskers which are comprised of $Si_3N_4$ at one end of the whisker and SiAlON at the other end. According to the present invention, particulate SiC is mixed with particulate AlN in approximate proportions of between 50:50 to 95:5. Most preferably, the ration of SiC to AlN is approximately 90:10. In one embodiment, the introduction of catalyzing agents such as CaO or KCl are added to the SiC/AlN mixture to control the whisker characteristics such as aspect ratio, conversion ratio of powder to whisker and uniformity of whisker size and growth. In a most preferred embodiment, the mixture is shaped in a boron nitrogen mold of a desired form. The mixture in the mold is then hot isostatically pressed in a nitrogen environment at sufficient temperature and pressure to convert the powders into $Si_3N_4$/SiAlON whisker preforms. Whisker reinforced composites can be formed using the $Si_3N_4$/SiAlON whiskers as the reinforcing medium and impregnating the preform with a matrix material such as resin binders, liquid metals, intermetallics or ceramic materials. Alternatively, the $Si_3N_4$/SiAlON preform can be converted into individual $Si_3N_4$/SiAlON whiskers by grinding or crushing the preform. The individual whiskers can then be used as a reinforcement medium for composite article using conventional mixing techniques and consolidation methods of powder metallurgy.

DETAILED DESCRIPTION OF THE INVENTION

The present invention comprises a process for manufacturing $Si_3N_4$/SiAlON whisker preforms, which preforms can be infiltrated with various matrix materials to form composites. Alternatively, the $Si_3N_4$/SiAlON whiskers preforms could be pulverized by crushing or grinding to form individual whiskers for various uses including composite reinforcement using standard powder metallurgy techniques.

In accordance with the invention, silicon carbide (SiC) powder and aluminum nitride (AlN) powder are mixed. The SiC powder can be α-SiC or β-SiC powder, however, it has been observed that the α-SiC powder provided significant improvements in all traits except whisker diameter, while the β-SiC powder results in larger diameter whiskers. Specifically, α-SiC powder resulted in a greater aspect ratio, conversion efficiency, uniformity of whisker size and growth and clean whiskers (i.e., no branching or "worm castings"). Preferably the particle size of the SiC and AlN is between 0.1 and 10 μm.

Preferably the ratio of SiC to AlN is in the range of from 50:50 to 95:5. Most preferably, the ratio of SiC to AlN is approximately 90:10. Applicant has observed that the uniformity of the whisker growth and the whisker cleanliness are significantly influenced by the amount of AlN. Smaller amounts of AlN provide cleaner, more uniform whisker growth.

Applicant has further discovered that catalyzing agents, such as KCl or CaO, are important in controlling whisker traits, such as aspect ratio, conversion ratio of powder to whiskers, and uniformity of whisker size and growth. All whisker traits, except for whisker diameter, were enhanced by the use of KCl. Preferably, the amount of catalyzing agent is in the range of 0.1 to 5 wt % of the silicon carbide and aluminum nitride mixture, and most preferably 1–2 wt % of KCl is used in the process of the present invention.

In an alternate embodiment of the invention, an organic binder such as polyvinyl pyrrilidone (PVP) can be added to the SiC/AlN powder mixture to provide additional carbon. The organic binder is added as part of an alcohol solution in order to facilitate the mixing of the SiC and AlN. After complete mixing of the powders, the slurry is dried while stirring continuously in order to prevent binder segregation. The dried mixture can be ground lightly to break up any large agglomerates. With fine SiC and AlN powder however, the organic binder can be eliminated from the process.

The powder mixture is then shaped using standard methods of ceramic processing, e.g., dry pressing, slip casting, extrusion, injection molding. In a preferred embodiment of the invention, the mixture is shaped in a boron nitrogen (BN) mold. The BN mold is inert to the chemical reaction and can be any size, shape, or configuration of the desired final article.

The mold containing the SiC and AlN mixture is then hot isostatically pressed in a $N_2$ gas atmosphere to a pressure of approximately 20,000 psi to 30,000 psi and a temperature of between 1800° C. to 2000° C. for approximately thirty minutes to convert the powders to whiskers. Densification of the powder mixtures is not desired.

It is believed that the resultant whiskers are formed by the vapor-liquid-solid (VLS) mechanism. In this mechanism, a drop of liquid supersaturates with gaseous components and a solid whisker continually grows from the liquid as more gases are supplied. The liquid droplet stays at one end of the whisker. The liquid phases are formed by the primary constituents and impurities. For the case of CaO, this liquid is in the Ca—Al—Si—O—N system. In the case of KCl, the liquid is in the form of K—Al—Si—O—N. Surface oxide coatings on the SiC and AlN powders (i.e., $SiO_2$ and $Al_2O_4$) provide additional oxygen.

By using a scanning transmission electron microscope and energy dispersive x-ray spectrometry techniques, Applicant has determined that the liquid droplet end of the resultant whisker is a $Si_3N_4$ composition, while the originating end of the whisker consists of SiAlON. By controlling the amount of catalyzing agent used (i.e., CaO or KCl) and AlN, Applicant is able to control the relationship between the $Si_3N_4$ and SiAlON in the whiskers. This unique characteristic provides several advantage over existing $Si_3N_4$ whiskers and SiAlON whiskers. For example, the $Si_3N_4$/SiAlON whiskers in the preform remain as individual whiskers to a higher volume fraction as compared to regular powder metallurgy techniques, thereby providing higher strength, modulus and toughness values in composites. Also, $Si_3N_4$ is particularly difficult to wet using molten aluminum, whereas, molten aluminum rather easily wets SiAlON. Therefore the molten aluminum would be wicked more easily into the $Si_3N_4$/SiAlON preform, as opposed to a preform consisting of $Si_3N_4$ whiskers, but would still maintain the desired qualities of the $Si_3N_4$ fiber reinforced composite. Another advantage of the $Si_3N_4$/SiAlON whiskers is that toughness in ceramic matrix composites is improved since, the $Si_3N_4$ end of the whisker will react heavily with the ceramic matrix during fabrication, while the other end (i.e., SiAlON) does not. During fracture the $Si_3N_4$ end sticks in matrix while the unbonded SiAlON end easily "pulls-out" of matrix which adsorbs energy during the process and increases fracture toughness. Additionally, fatigue resistance of metal matrix composites is enhanced. Strains due to dislocation movements resulting from thermal cycling or cyclic stresses are more easily accommodated by whiskers that are not strongly bonded to the matrix at one end.

In a preferred embodiment of the invention, whisker reinforced composites are formed where the $Si_3N_4$/SiAlON whiskers are the reinforcing medium. In this embodiment, the $Si_3N_4$/SiAlON whisker preform is impregnated with a matrix material. Preferably, the matrix material is selected from the group consisting of resin binders, liquid metals, intermetallics, or ceramic materials.

Suitable resin binders include epoxies, polyesters, polyethereketone (PEEK), K-polymer (a registered trademark of E. I. dupont de Nemours and Company), thermoplastic polyimides and polyphenylene sulfide (PPS). Conventional vacuum infiltration can be utilized to put uncured resin into the $Si_3N_4$/SiAlON whisker preform and then cured by conventional means. Suitable liquid metals include aluminum, magnesium and titanium, and their alloys. The $Si_3N_4$/SiAlON whisker can be infiltrated by conventional means such as vacuum infiltration or "squeeze" casting. Solidification of the metal is accomplished by cooling. Suitable ceramics include silicon carbide, silicon nitride, aluminum nitride, boron carbide, SiAlON's, aluminum oxycarbides, zirconia, alumina, mullite, cordierite, borosilicate and other glasses, silica, low CTE materials such as zirconium phosphates (MZP), lithium aluminosilicates and aluminum titinates, molybdenum disilicide, titanium diboride and graphite. Suitable intermetallics include nickel alumindes, titanium alumindes, iron alumindes and aluminum niobates.

In still a further embodiment of the invention, the $Si_3N_4$/SiAlON preform can converted to individual $Si_3N_4$/SiAlON whiskers by grinding or crushing the preform. The individual whiskers can then be used as the reinforcement medium for composite articles using conventional mixing techniques and consolidation methods of powder metallurgy.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments described explain the principles of the invention and practical application and enable others skilled in the art to utilize the invention in various embodiments and with various modifications as are suited to the particular use contemplated. It is intended that the scope of the invention be defined by the claims appended hereto.

The embodiments of this invention in which an exclusive property or privilege is claimed are defined as follows:

1. A method for making a silicon nitride/SiAlON preform article, the method comprising the steps of:

(a) mixing particulate silicon carbide with particulate aluminum nitride and a catalyzing agent, said catalyzing agent being selected from the group consisting of calcium oxide and potassium chloride, to form a mixture;

(b) forming the mixture into a desired shape;

(b) reacting the formed mixture with a gas at a sufficient temperature and pressure to impose free nitrogen to convert the formed mixture into a whisker composition, the individual whiskers consisting substantially of silicon nitride at one end, and SiAlON at the other end.

2. The method of claim 1 wherein the ratio of silicon nitride powder to aluminum nitride powder is in the range of from 95:5 to 50:50.

3. The method of claim 1 wherein the amount of catalyzing agent is in the range of from 0.1 to 5 wt % of the mixture.

4. The method of claim 1 wherein the gas is nitrogen.

5. The method of claim 1 wherein the temperature of the gas is in the range of from 1800° C. to 2000° C.

6. The method of claim 1 wherein the pressurized atmosphere is in the range of from 20,000 psia to 30,000 psia.

7. The method of claim 1 further comprising the step of adding an organic binder to the mixture.

8. A method for making a silicon nitride/SiAlON blend whisker reinforced composite, said method comprising the steps of:

(a) mixing particulate silicon carbide with particulate aluminum nitride and a catalyzing agent, said catalyzing agent being selected from the group consisting of calcium oxide and potassium chloride, to form a mixture;

(b) compacting the mixture to a desired shape;

(c) reacting said compacted mixture with a gas at a sufficient temperature and pressure to impose free nitrogen to convert the compacted mixture to a silicon nitride and SiAlON whisker composition;

(d) impregnating said whisker blend composition with a matrix material; and (e) solidifying said matrix material to form said whisker reinforced composite.

9. The method of claim 8 wherein the gas is nitrogen.

10. The method of claim 8 wherein the temperature of the gas is in the range of from 1800° C. to 2000° C.

11. The method of claim 8 wherein the pressurized atmosphere is in the range of from 20,000 psia to 30,000 psia.

12. The method of claim 8 wherein said matrix material is selected from the group consisting of a resin binder, a liquid metal, a colloidal suspension, an ionic solution and at least one gaseous material capable of being solidified to form a matrix.

13. The method of claim 8 further comprising the step of treating said liquid metal with a wetting agent prior to the impregnating step to facilitate the wetting of said whiskers by said metal.

14. A method of forming individual silicon/SiAlON whiskers, said method comprising the steps of:

(a) mixing particulate silicon carbide with particulate aluminum nitride and a catalyzing agent, said catalyzing agent being selected from the group consisting of calcium oxide and potassium chloride, to form a mixture;

(b) compacting the mixture;

(c) reacting the compacted mixture with a gas at a sufficient temperature and pressure to impose free nitrogen to convert said mixture into a silicon nitride/SiAlON whiskers composition;

(d) crushing the silicon nitride/SiAlON whiskers composition to form a silicon nitride/SiAlON whisker powder.

15. The method of claim 14 wherein the gas is nitrogen.

16. The method of claim 14 wherein the temperature of the gas is in the range of from 1800° C. to 2000° C.

17. The method of claim 14 wherein the pressurized atmosphere is in the range of from 20,000 psia to 30,000 psia.

18. The method of claim 14 further comprising the step of mixing the silicon nitride/SiAlON whisker powder with a matrix material to form a composite.

19. The method of claim 8 wherein the amount of catalyzing agent is in the range of 0.1 to 5 wt % of the mixture.

20. The method of claim 14 wherein the amount of catalyzing agent is in the range of from 0.1 to 5 wt % of the mixture.

\* \* \* \* \*